United States Patent
Yang

(10) Patent No.: US 7,577,409 B2
(45) Date of Patent: Aug. 18, 2009

(54) LOAD-BASED VOLTAGE CONTROL WIRELESS TRANSMISSION SYSTEM

(76) Inventor: Tai-Her Yang, 6F-5 No. 250, Sec. 4, Chung Hsiao E. Rd., Taipei (TW)

( * ) Notice: Subject to any disclaimer, the term of this patent is extended or adjusted under 35 U.S.C. 154(b) by 683 days.

(21) Appl. No.: 11/404,863

(22) Filed: Apr. 17, 2006

(65) Prior Publication Data

US 2007/0242644 A1    Oct. 18, 2007

(51) Int. Cl.
 *H04B 1/04* (2006.01)
(52) U.S. Cl. .............. 455/127.5; 455/334; 455/343.1; 455/572
(58) Field of Classification Search ... 455/127.1–127.5, 455/334, 341, 343.1–343.6, 572–574
See application file for complete search history.

(56) References Cited

U.S. PATENT DOCUMENTS

| | | | |
|---|---|---|---|
| 6,408,170 B1 * | 6/2002 | Schmidt et al. | 455/344 |
| 6,427,065 B1 * | 7/2002 | Suga et al. | 455/41.1 |
| 6,643,527 B2 * | 11/2003 | Satoh et al. | 455/574 |
| 6,836,472 B2 * | 12/2004 | O'Toole et al. | 370/335 |
| 7,184,722 B1 * | 2/2007 | Johnson et al. | 455/127.1 |
| 7,283,794 B2 * | 10/2007 | Molnar et al. | 455/127.5 |
| 7,505,742 B2 * | 3/2009 | Sharp et al. | 455/127.1 |

* cited by examiner

*Primary Examiner*—Nhan T Le
(74) *Attorney, Agent, or Firm*—Bacon & Thomas, PLLC

(57) ABSTRACT

A wireless transmission system with its voltage controllable depending on the load by increasing or decreasing the wireless transmission system related circuit drive voltage and selecting a drive voltage of the wireless transmission system related circuit to improve or reduce the strength of the wireless transmission signals as required according to the distance and environment of the communication.

9 Claims, 5 Drawing Sheets

LOAD-BASED VOLTAGE CONTROL WIRELESS TRANSMISSION SYSTEM

BACKGROUND OF THE INVENTION (a) Field of the Invention

The present invention is related to a load-base voltage control wireless transmission system, and more particularly, to one applied for conventional wireless data process and communication, such as that applied in a wireless mouse, wireless keyboard, wireless scanner, wireless microphone, wireless speaker, wireless remote controller, wireless on-net device, wireless telephone, wireless detection device or wireless alarm by using RF electromagnetic, infrared, or ultrasonic wave to execute AM, FM, or digital wireless transmission to improve application convenience, as evidenced by the Blue Tooth-based products recently introduced as one of the similar indices of the technology development in wireless communication.

(b) Description of the Prior Art

Conventional mode of wireless transmission is done by having the RF electromagnetic, infrared or ultrasonic wave to executed AM, FM, or digital wireless transmission making applications of wireless communication more convenient, such as that of Blue Tooth-based products recently introduced to become one of the indices of the technology development in wireless communication. However, the power storage capacity of the wireless communication is limited by its portable source, and the application of wireless transmission is also confined due to it operates on a fixed voltage that varies depending on the size of the signals.

SUMMARY OF THE INVENTION

The primary purpose of the present invention is to provide a wireless transmission system with its voltage controllable depending on the load by increasing or decreasing the wireless transmission system related circuit drive voltage and selecting a drive voltage of the wireless transmission system related circuit to improve or reduce the strength of the wireless transmission signals as required according to the distance and environment of the communication.

DETAILED DESCRIPTION OF THE PREFERRED EMBODIMENTS

Conventional mode of wireless transmission is done by having the RF electromagnetic, infrared or ultrasonic wave to executed AM, FM, or digital wireless transmission making applications of wireless communication more convenient, such as that of Blue Tooth-based products recently introduced to become one of those indices of the technology development in wireless communication. However, the power storage capacity of the wireless communication is limited by its portable source, and the application of wireless transmission is also confined due to it operates on a fixed voltage that varies depending on the size of the signals.

The primary purpose of the present invention is to provide a wireless transmission system with its voltage controllable depending on the load by increasing or decreasing the wireless transmission system related circuit drive voltage and selecting a drive voltage of the wireless transmission system related circuit to improve or reduce the strength of the wireless transmission signals as required according to the distance and environment of the communication.

Figure 1:
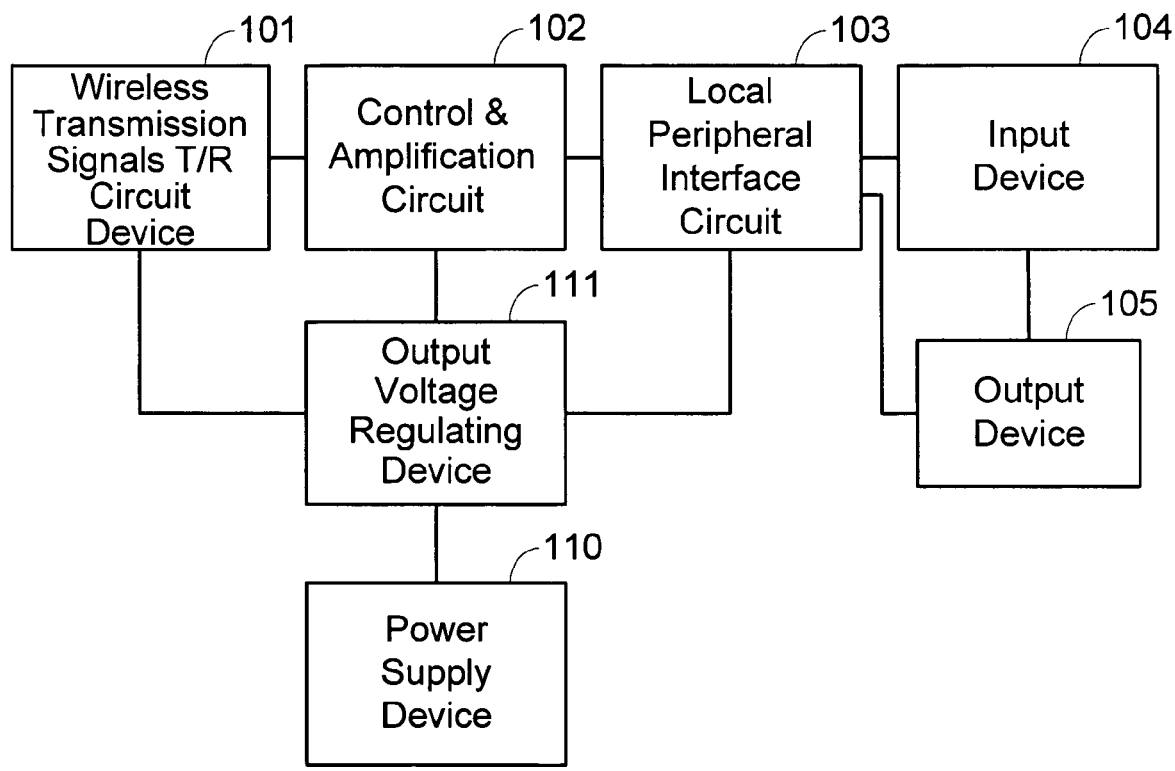
FIG. 1 is a circuit block chart of the present invention.

FIG. 1 is a circuit block chart of a load-based voltage control wireless transmission system of the present invention. The present invention is essentially comprised of:

a wireless transmission signals T/R circuit device 101: comprised of an IC, a solid-state electronic device or a dynamo-electric device adapted with related transmission circuit device, receiving circuit device, or transmission and receiving circuit devices, or two or more than two wireless transmission means as applicable to have RF electromagnetic, optical (e.g., Infrared), or ultrasonic wave executing AM, FM or digital transmission;

a control & amplification circuit 102: provides the function to amplify and output those electric or optical signals received from the wireless transmission signals T/R circuit device 101 to a local peripheral interface circuit 103 to be described below, or to amplify and output those electric signals received from the local peripheral interface circuit 103 to the wireless transmission signals T/R circuit device 101 for transmission, or to provide both functions as described above;

a local peripheral interface circuit 103: relates to a circuit dedicated to the subject matter of the application comprised of an electronic circuit device selected depending on the function of wireless information transmission or wireless communication adapted to the peripheral device of the subject matter of application to provide interface circuit function between the wireless transmission signals T/R circuit device 101 or the control and amplification circuit 102 and an input device 104 or an output device 105 to be described below of the peripheral device of the subject matter of the application; the local peripheral interface circuit 103 is an optional item to be provided according to the peripheral device and system matching requirements; and it is to be noted that the working voltage of any of those devices providing wireless transmission functions and its associate wireless transmission signals T/R circuit device 101, the control and amplification circuit 102, and the local peripheral interface circuit 103 as described above ranges between the lower normal voltage and the maximal voltage after the actuation of the voltage rise mechanism; and a power supply device 110: comprised of one or a plurality of a DC electric storage device including disposable primary battery, rechargeable battery, storage capacitor, or ultra capacitor; characterized in that an output voltage regulating device 111 to be described below comprised of dynamo-electric device or dynamo-electric device may be provided as applicable so to activate either by manual or by being subject to the control of the local peripheral interface circuit 103 the voltage rise mechanism for upgrading the voltage in linear or by stepping mode to supply power to any of those devices providing wireless transmission functions and its associate wireless transmission signals T/R circuit device 101, the control and amplification circuit 102, and the local peripheral interface circuit 103 as described above.

Figure 2:
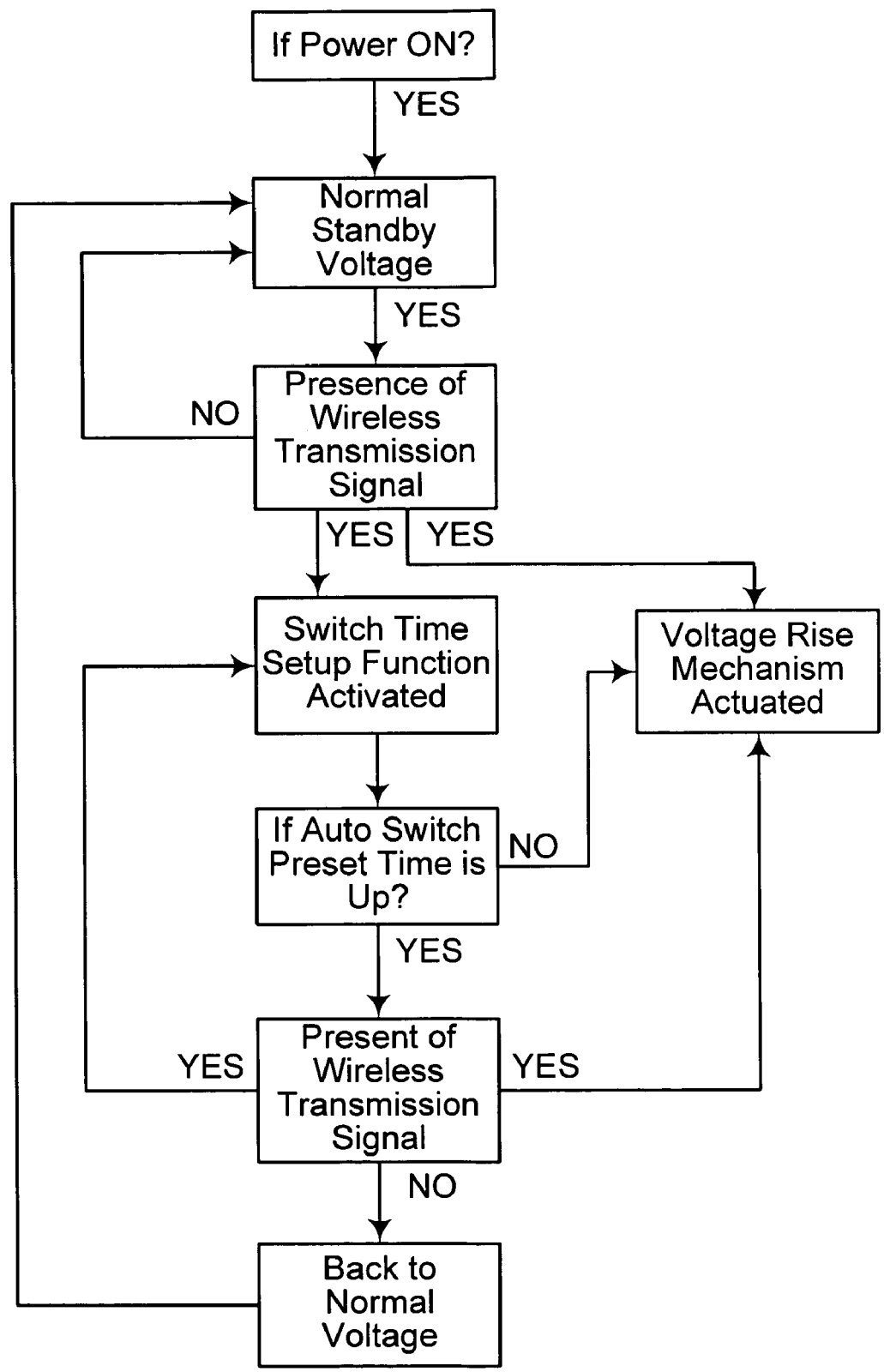
FIG. 2 is an open-loop process flow chart of the present invention.

The circuit operation modes of the present invention include:

(1) Open-loop mode: both of T/R performance and transmission range are improved by means of the voltage rise mechanism actuated by wireless transmission signals; and the voltage is automatically returned to normal status when the preset automatic switch time is up; once the preset time for automatic switch is up and the wireless transmission signals continue, the automatic switch time is reset to activate the voltage rise mechanism once against until the wireless transmission signals are terminated to return to the voltage of normal status as illustrated in FIG. 2 for the open-loop process flow chart of the present invention.

Figure 3:
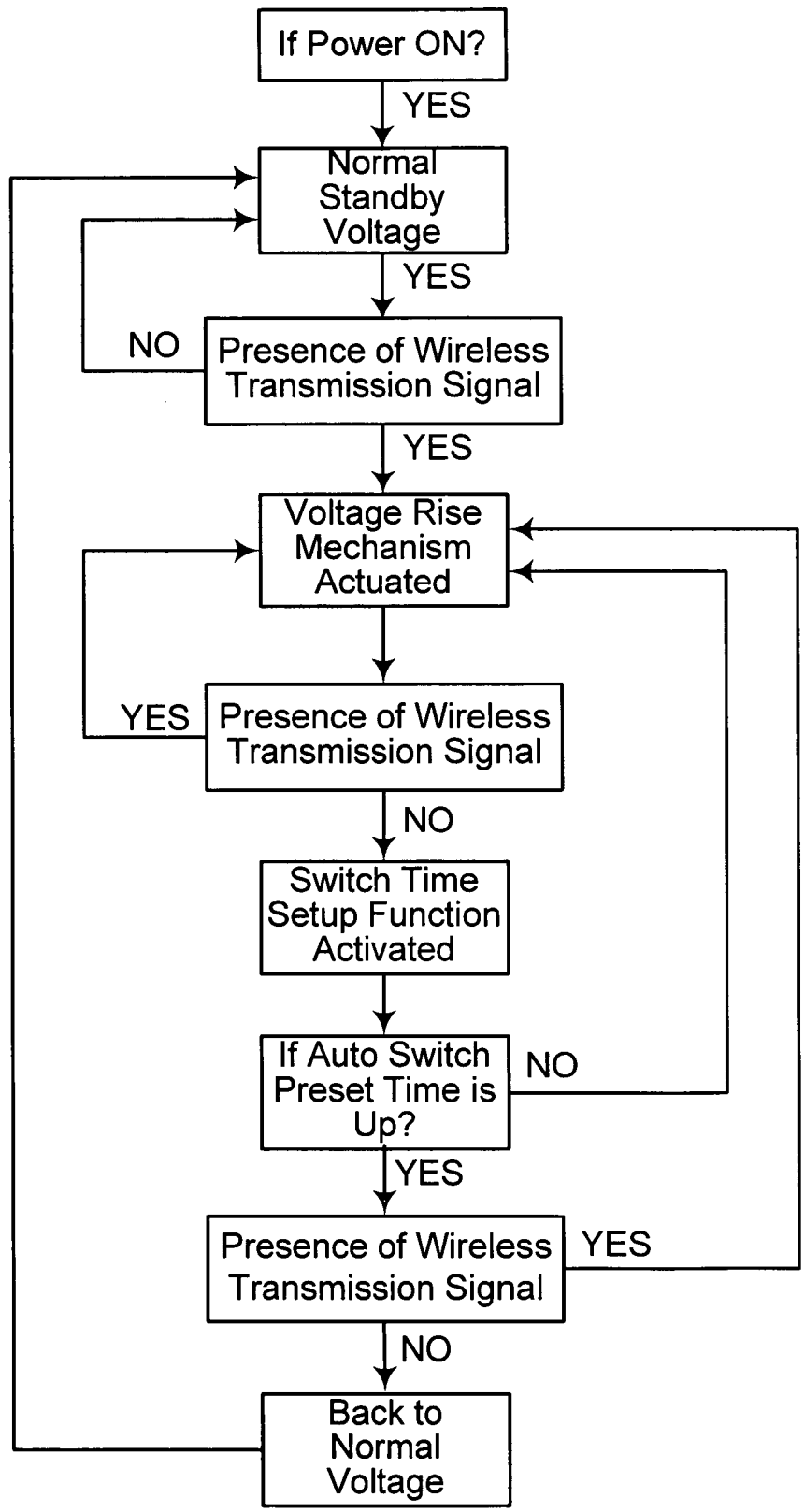
FIG. 3 is a closed-loop process flow chart of the present invention.

(2) Closed-loop mode: both of T/R performance and transmission range are improved by means of the voltage rise mechanism actuated by wireless transmission signals; the voltage rise mechanism is maintained if the wireless transmission signals sustain when the preset time for automatic switch is up with the automatic switch preset time remaining set in starting status without timing until the termination of the wireless transmission signals, and then the preset time start to count until the preset time is up to return to the voltage of normal status as illustrated in FIG. 3 for the closed-loop process flow chart of the present invention.

Figure 4:
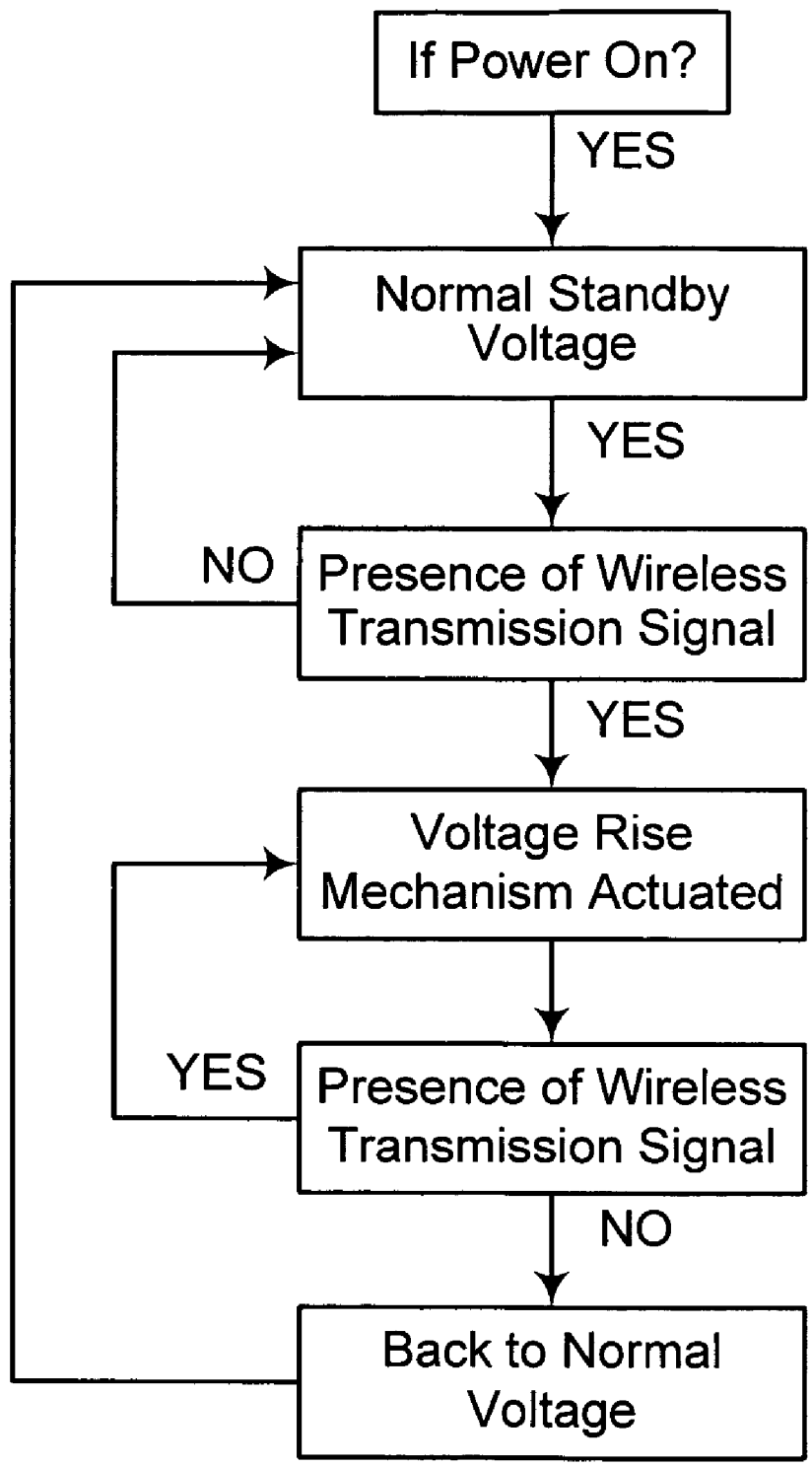
FIG. 4 is a synchronous process flow chart of the present invention.

(3) Synchronous mode: the voltage rise mechanism is synchronously activated upon the coming of the wireless signals, and the voltage is synchronously returned to its normal status upon the termination of the wireless transmission signals as illustrated in FIG. 4 for the synchronous process flow chart of the present invention.

Figure 5:
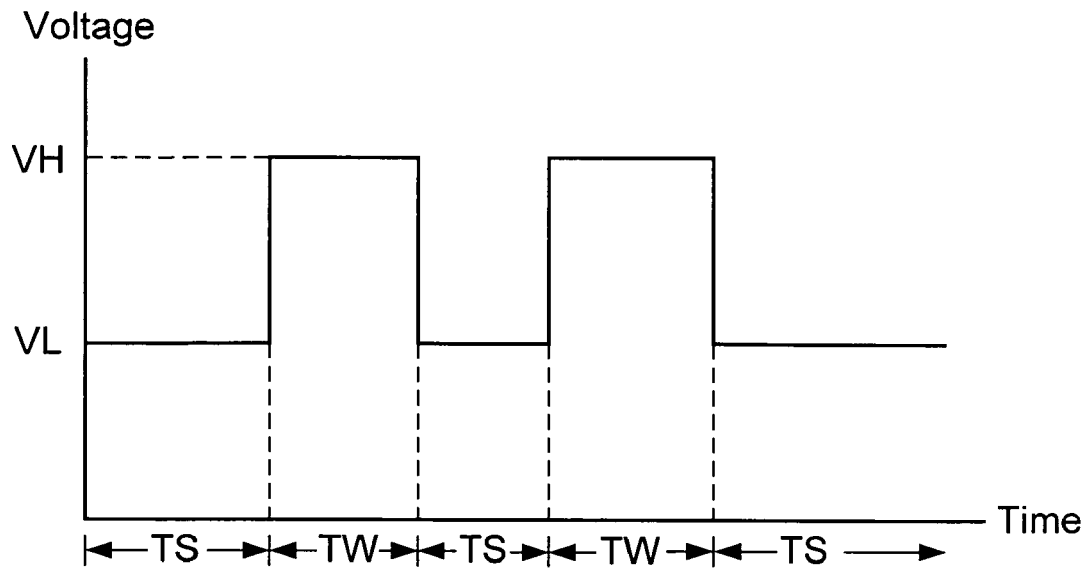
FIG. 5 is a schematic view showing the wireless transmission status of the present invention with low standby source voltage and high standby source voltage.
Figure 6:
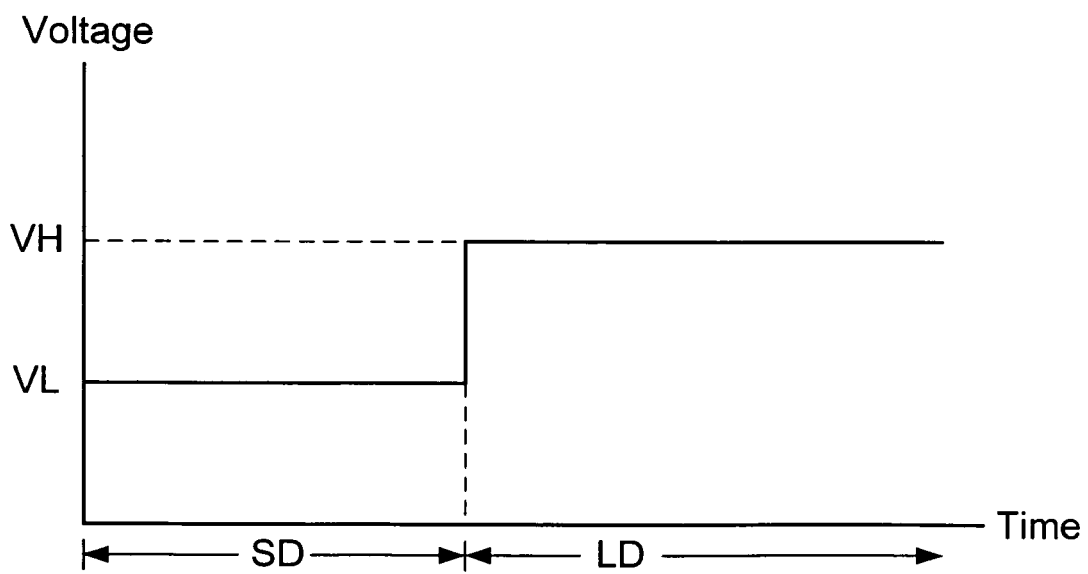
FIG. 6 is a schematic view showing a manual operation of the present invention to select source voltage supply depending on wireless transmission distance.

(4) The transmission of the drive voltage and/or the receiving voltage circuit is modulated by manual operation; and in this mode, the circuit operation is done at random by having manual regulation of the drive voltage or the specific value of amplification of the transmission or receiving power Operation modes for the load-based voltage control wireless transmission system of the present invention include:

1. In executing wireless transmission, the system is subject to the control by the local peripheral interface circuit 103 to regulate the output voltage from the power supply device 110 to such as the standby time (TS) is in the lower drive voltage (VL) supply status, is in the status of higher drive voltage (VH) supply during transmission or receiving (TW) as illustrated in FIG. 5 for a schematic view showing the wireless transmission status of the present invention with low standby source voltage and high standby source voltage; or 2. In case of a shorter distance (SD) communication, a lower drive voltage (VL) is selected by manual to execute wireless transmission; and in case of a longer distance (LD) communication, a higher drive voltage (VH) is selected by manual to execute wireless transmission as illustrated in FIG. 6 for a schematic view showing a manual operation of the present invention to select source voltage supply depending on wireless transmission distance or 3. The operation of the system includes upgrading the drive voltage as an emergency booster by manual to provide the function of wireless transmission; or 4. The preferred source voltage is selected by manual depending on the range and environment of wireless transmission.

A wireless transmission system of the present invention that allows load-based control of the voltage to be applied in wireless transmission functions for a wireless mouse, wireless keyboard, wireless scanner, wireless microphone, wireless speaker, wireless remote controller, wireless on-net device, wireless telephone, wireless detection device or wireless alarm device for upgrading the working voltage of any of those devices providing wireless transmission function and its associate wireless transmission signals T/R circuit device 101, the control and amplification circuit 102, and the local peripheral interface circuit 103 as described above thus to improve communication performance including extended communication distance and noise identification, is innovative with precise functions; therefore, this application for a patent is duly filed accordingly.

I claim:

1. A load-based voltage control wireless transmission system by increasing or decreasing the wireless transmission system related circuit drive voltage and selecting a drive voltage of the wireless transmission system related circuit to improve or reduce the strength of the wireless transmission signals as required according to the distance and environment of the communication is essentially comprised of:

a wireless transmission signals T/R circuit device 101: comprised of an IC, a solid-state electronic device or a dynamo-electric device adapted with related transmission circuit device, receiving circuit device, or transmission and receiving circuit devices, or two or more than two wireless transmission means as applicable to have RF electro-magnetic, optical (e.g., Infrared), or ultrasonic wave executing AM, FM or digital transmission;

a control & amplification circuit 102: provides the function to amplify and output those electric or optical signals received from the wireless transmission signals T/R circuit device 101 to a local peripheral interface circuit 103 to be described below, or to amplify and output those electric signals received from the local peripheral interface circuit 103 to the wireless transmission signals T/R circuit device 101 for transmission, or to provide both functions as described above;

a local peripheral interface circuit 103: relates to a circuit dedicated to the subject matter of the application comprised of an electronic circuit device selected depending on the function of wireless information transmission or wireless communication adapted to the peripheral device of the subject matter of application to provide interface circuit function between the wireless transmission signals T/R circuit device 101 or the control and amplification circuit 102 and an input device 104 or an output device 105 to be described below of the peripheral device of the subject matter of the application; the local peripheral interface circuit 103 is an optional item to be provided according to the peripheral device and system matching requirements; and an output voltage regulating device 111 providing voltage to wireless transmission functions and its associate wireless transmission signals T/R circuit device 101, the control and amplification circuit 102, and the local peripheral interface circuit 103 as described above ranges between the lower normal voltage and the maximal voltage after the actuation of the voltage rise mechanism; and a power supply device 110: comprised of one or a plurality of a DC electric storage device including disposable primary battery, rechargeable battery, storage capacitor, or ultra capacitor; characterized in that an output voltage regulating device 111 to be described below comprised of dynamo-electric device or dynamo-electric device may be provided as applicable so to activate either by manual or by being subject to the control of the local peripheral interface circuit 103 the voltage rise mechanism for upgrading the voltage in linear or by stepping mode to supply power to any of those device providing wireless transmission functions and its associate wireless transmission signals T/R circuit device 101, the control and amplification circuit 102, and the local peripheral interface circuit 103 as described above.

2. A load-based voltage control wireless transmission system of claim 1, wherein the operation is provided in an open-loop mode; both of T/R performance and transmission range are improved by means of the voltage rise mechanism actuated by wireless transmission signals; and the voltage is automatically returned to normal status when the preset automatic switch time is up; once the preset time for automatic switch is up and the wireless transmission signals continue, the automatic switch time is reset to activate the voltage rise mechanism once against until the wireless transmission signals are terminated to return to the voltage of normal status.

3. A load-based voltage control wireless transmission system of claim 1, wherein the operation is provided in a closed-loop; both of T/R performance and transmission range are improved by means of the voltage rise mechanism actuated by wireless transmission signals; the voltage rise mechanism is maintained if the wireless transmission signals sustain when the preset time for automatic switch is up with the automatic switch preset time remaining set in starting status without timing until the termination of the wireless transmission signals, and then the preset time start to count until the preset time is up to return to the voltage of normal status.

4. A load-based voltage control wireless transmission system of claim 1, wherein the operation is provided in a synchronous mode; the voltage rise mechanism is synchronously activated upon the coming of the wireless signals, and the voltage is synchronously returned to its normal status upon the termination of the wireless transmission signals.

5. A load-based voltage control wireless transmission system of claim 1, wherein the transmission of the drive voltage and/or the receiving voltage circuit is modulated by manual operation; and in this mode, the circuit operation is done at random by having manual regulation of the drive voltage or the specific value of amplification of the transmission or receiving power.

6. A load-based voltage control wireless transmission system of claim 1, wherein the system in executing wireless transmission is subject to the control by the local peripheral interface circuit 103 to regulate the output voltage from the power supply device 110 to such as the standby time (TS) is in the lower drive voltage (VL) supply status, is in the status of higher drive voltage (VH) supply during transmission or receiving (TW).

7. A load-based voltage control wireless transmission system of claim 1, wherein the operation of the system includes that in case of a shorter distance (SD) communication, a lower drive voltage (VL) is selected by manual to execute wireless transmission; and that in case of a longer distance (LD) communication, a higher drive voltage (VH) is selected by manual to execute wireless transmission.

8. A load-based voltage control wireless transmission system of claim 1, wherein the operation of the system includes upgrading the drive voltage by manual as an emergency booster to provide the function of wireless transmission.

9. A load-based voltage control wireless transmission system of claim 1, wherein the preferred source voltage is selected by manual depending on the range and environment of wireless transmission.

* * * * *